United States Patent
Mitchell et al.

(10) Patent No.: US 7,462,999 B2
(45) Date of Patent: Dec. 9, 2008

(54) BRUSHLESS SERVO MOTOR TESTER

(75) Inventors: Lawrence Hardy Mitchell, Athens, OH (US); Stuart Glen Mitchell, Chicago, IL (US)

(73) Assignee: Mitchell Electronics, Inc, Athens, OH (US)

( * ) Notice: Subject to any disclaimer, the term of this patent is extended or adjusted under 35 U.S.C. 154(b) by 0 days.

(21) Appl. No.: 11/391,832

(22) Filed: Mar. 29, 2006

(65) Prior Publication Data
US 2007/0229018 A1   Oct. 4, 2007

(51) Int. Cl.
*G01R 31/34* (2006.01)
(52) U.S. Cl. ............. 318/490; 318/400.01; 318/400.38; 324/179; 324/772
(58) Field of Classification Search ............... 318/138, 318/254, 439, 490, 720–724, 400.01, 400.04, 318/400.37, 400.38, 700; 324/177–178, 324/772, 179, 117 H, 527; 73/116
See application file for complete search history.

(56) References Cited

U.S. PATENT DOCUMENTS

| | | | | |
|---|---|---|---|---|
| 3,924,167 A | * | 12/1975 | Clark et al. | 318/254 |
| 4,027,212 A | * | 5/1977 | Studer | 318/138 |
| 4,743,848 A | * | 5/1988 | Krimm et al. | 324/772 |
| 4,744,041 A | * | 5/1988 | Strunk et al. | 702/84 |
| 4,777,446 A | * | 10/1988 | Santandrea et al. | 324/545 |
| 4,868,467 A | * | 9/1989 | Davis | 318/254 |
| 4,922,172 A | * | 5/1990 | Roddy et al. | 318/490 |
| 5,291,128 A | * | 3/1994 | Shekar et al. | 324/772 |
| 5,524,498 A | * | 6/1996 | Thompson et al. | 73/865.9 |
| 5,751,125 A | * | 5/1998 | Weiss | 318/280 |
| 6,098,026 A | * | 8/2000 | Lee | 702/115 |
| 6,768,281 B2 | * | 7/2004 | Koski | 318/490 |
| 7,015,664 B2 | * | 3/2006 | Coles et al. | 318/400.01 |
| RE39,076 E | * | 4/2006 | von der Heide et al. | 318/400.4 |
| 2001/0030517 A1 | * | 10/2001 | Batzel | 318/254 |

* cited by examiner

*Primary Examiner*—Bentsu Ro
(74) *Attorney, Agent, or Firm*—David G. Herold

(57) ABSTRACT

A permanent magnet brushless (PMBL) servo motor test apparatus and method allow testing of a motor in place. A set of static and dynamic tests is performed to determine proper motor operation of armature windings and rotor feedback devices. The test system of the present invention displaces the motor drive system. The test system comprises an armature driver, a feedback device input, and a system controller. The armature windings of the motor-under-test are driven in a polarity sequence according to a test sequence, whereby the rotor is driven in a series of rotations. Angle feedback is tested at a plurality of said rotations. Rotor velocity outputs are tested during said rotations. Armature current and voltage are determined at a plurality of said rotations and winding balance is tested. Said power switch is also operative to apply a voltage between the armature windings and the motor case to test for fault current flow.

In another embodiment of the invention, motor identification is decoded by the system into motor configuration and motor operation parameters, necessary to test the motor. Motor identification may be entered by an operator or captured from machine readable tags such as a barcode tag or an RFID tag.

14 Claims, 11 Drawing Sheets

| Shaft Angle Range | Hall Sensor Output States | | | Armature Drive Commutation Pattern | | |
|---|---|---|---|---|---|---|
| Degrees | A | B | C | U | V | W |
| 0-60˚ | 1 | 0 | 1 | + | | - |
| 60-120˚ | 1 | 0 | 0 | + | - | |
| 120-180˚ | 1 | 1 | 0 | | - | + |
| 180-240˚ | 0 | 1 | 0 | - | | + |
| 240-300˚ | 0 | 1 | 1 | - | + | |
| 300-360˚ | 0 | 0 | 1 | | + | - |

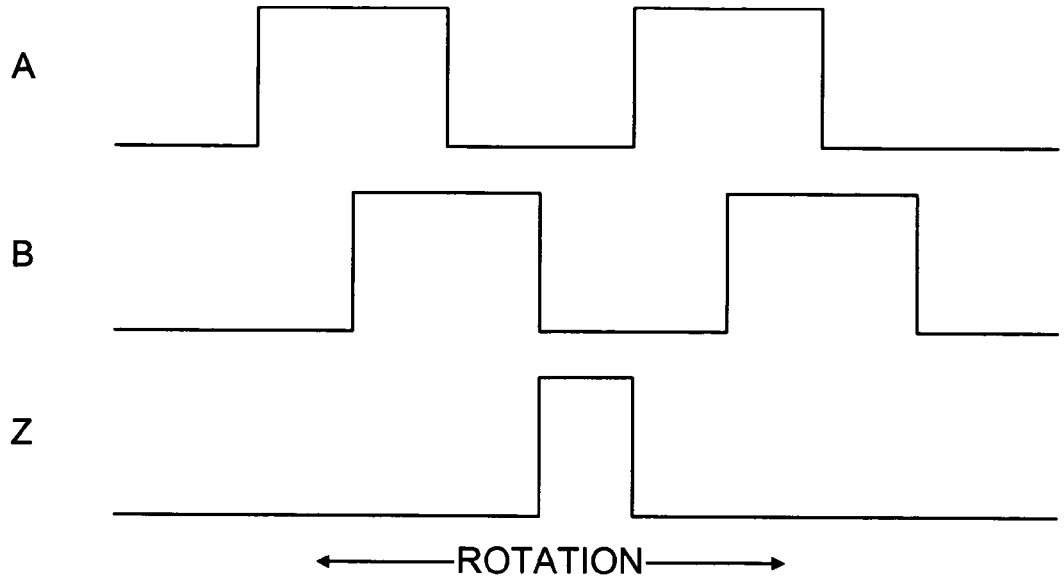
FIG. 3E
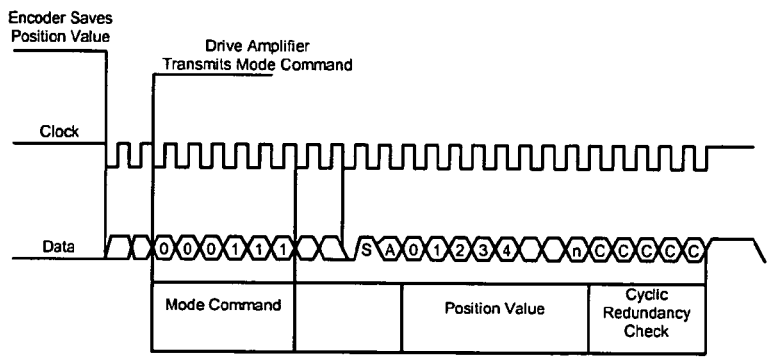
FIG. 3F
| A | B | Position Count |
|---|---|---|
| LO to HI | LO | Inc |
| HI to LO | HI | Inc |
| HI | LO to HI | Inc |
| LO | HI to LO | Inc |
| LO to HI | HI | Dec |
| HI to LO | LO | Dec |
| LO | LO to HI | Dec |
| HI | HI to LO | Dec |
FIG. 3G

| Rotor Stall Angle (Degrees) | Armature Drive U V W |
|---|---|
| 0 | - + + |
| 60 | - - + |
| 120 | + - + |
| 180 | + - - |
| 240 | + + - |
| 300 | - + - |

| MOTOR_ID_1 601 | PTR1->MOTOR_ID_2 602 |
|---|---|
| FEEDBACK DEVICE 1 TYPE 609 | |
| FEEDBACK DEVICE 1 PARAMETERS 611 | |
| FEEDBACK DEVICE 2 TYPE 610 | |
| FEEDBACK DEVICE 2 PARAMETERS 612 | |
| NULL 613 | |
| RATED ARMATURE CURRENT 614 | |
| ROTOR POLES 615 | |
| MOTOR_ID_2 603 | PTR2->MOTOR_ID_3 604 |
| FEEDBACK DEVICE 1 TYPE | |
| FEEDBACK DEVICE 1 PARAMETERS | |
| FEEDBACK DEVICE 2 TYPE | |
| FEEDBACK DEVICE 2 PARAMETERS | |
| NULL | |
| RATED ARMATURE CURRENT | |
| ROTOR POLES | |
| MOTOR_ID_3 605 | PTR3->MOTOR_ID_4 606 |

. . .

| MOTOR_ID_N 607 | NULL 608 |
|---|---|
| FEEDBACK DEVICE 1 TYPE | |
| FEEDBACK DEVICE 1 PARAMETERS | |
| NULL | |
| RATED ARMATURE CURRENT | |
| ROTOR POLES | |

FIG. 10

BRUSHLESS SERVO MOTOR TESTER

BACKGROUND

1. Field of Invention

This invention relates generally to a brushless servo motor tester and specifically to a brushless servo motor tester that tests a motor in its operating environment.

2. Description of Prior Art

Industrial automation applications often use permanent magnet brushless (PMBL) servo motors for positioning. Applications are often complex, three-dimensional positioning along with rotary alignment requiring multiple axes of control, operating cooperatively, to accomplish a task.

A typical PMBL servo motor comprises an armature with armature windings, a rotor, and rotor state feedback. The rotor is connected to, and is rotatably supported by, a motor shaft, on an axis of rotation. The rotor angle is a mechanical angle representing shaft rotation. The rotor comprises one or more permanent magnet pole pairs. The armature windings, when powered, produce an armature magnetic field that interacts with the rotor field to produce rotor torque. The armature windings are disposed about the circumference of the rotor. PMBL servo motors typically have three armature windings or phases, but must have at least two.

PMBL servo motors require commutation of the power applied to the armature windings to operate. Commutation switches the DC power applied to the armature windings into a polarity sequence that generates a rotating armature magnetic field. The armature field rotates about the rotor axis. Commutation of armature power is synchronized to the rotor angle. FIG. 1 depicts a typical control axis. The inner loop of the control axis comprises PMBL servo motor 10 and drive system 20. Electronics in drive system 20 produce drive signals 30 to power the armature windings to move the rotor. Drive system 20 synchronizes armature drive signals 30 to the rotor angle by means of rotor state feedback 40. Rotor state feedback comprises rotor angle and, depending on the motor, may include velocity and/or accumulated rotor angle. Generally, the commutation sequence of drive signals 30 controls the direction of motor rotation, while drive voltage level determines motor rotation speed. Rotor torque increases with armature current. The inner control loop is responsible for commutation of power supplied to the armature windings along with speed and direction control.

The armature magnetic field angle, also called the electrical angle, rotates N times per shaft revolution for a 2N-pole rotor. Drive system 20 generally produces armature drive at the electrical angle that produces maximum rotor torque at the current rotor angle.

The outer control loop comprises controller 60 in addition to the inner control loop. The outer control loop is responsible for coordination of the local control axis with the larger system requirements. Sensor inputs 70, control inputs 80, and rotor state feedback 40 are used to determine the required speed and direction input 50 to drive system 20.

PMBL servo motors generally have three phase armature windings comprising three windings. The three windings are generally interconnected either in a wye or delta configuration. In the wye configuration, one end of each of the three windings is connected together, leaving three terminals to power the armature. In the delta connection, the windings form the three legs of a triangle, with armature power applied to the terminals formed at the three vertices of the triangle. In both cases, applying power between terminals powers multiple windings.

Two types of PMBL servo motors are in use, DC and AC. AC and DC motors are similar in construction. DC motors generally use six-state commutation that advances the electrical angle in sixty-degree steps. DC motors often use a Hall effect angle encoder to produce rotor state feedback. Six-state angle encoders provide sixty-degree angle resolution of the electrical angle. FIG. 2 shows typical armature drive polarity sequence for one revolution of a motor with a two-pole rotor. The electrical and mechanical angles of a two-pole motor rotate at the same rate. The armature excitation is a DC voltage applied across two terminals at a time at a constant voltage (for a given speed). A given pair of armature terminals is powered for 60-degrees of rotor rotation before the armature excitation is moved to a different terminal pair.

PMBL AC servo motors have some advantages over PMBL DC servo motors in providing finer positioning capability and smoother torque. These advantages come at the cost of more complex drive requirements in drive system 20 that must provide three-phase sinusoidal drive to the motor armature windings. Sinusoidal armature drive in turn requires higher resolution rotor angle feedback. Applying DC servo motor armature drive signals to an AC servo motor will drive the rotor in accordance with FIG. 2 as with a DC servo motor. Servo motor design provides optimum performance with matching armature drive, however, both AC and DC servo motors will rotate in response to DC armature drive.

Because of the complexity of motion control system 90, including motor 10, drive system 20 and controller 60, when the system stops working, it is difficult to determine which component failed. Feedback systems are often difficult to diagnose and systems with multiple feedback loops, such as motion control system 90, compound the problem. Drive system 20 and controller 60 often perform fault checks and shut down when a fault is detected. Because the system is not moving, suspicion often falls on motor 10, which is then removed and replaced. Because these motors are often embedded in complex machine tools, costly downtime ensues and oftentimes the problem remains after motor replacement.

Several items must be identified in order to successfully test a motor. These include the motor operating parameters: rated current and the number of rotor poles, as well as the motor configuration: the feedback device types and related parameters. Motors are often not directly labeled with enough information to directly determine the operating parameters and configuration. The step of identifying the operating parameters and configuration from the motor part number is time consuming and error prone.

The prior art does not sufficiently address in situ servo motor testing. Accordingly, there exists a need for diagnostic equipment and methods to evaluate PMBL servo motors for failure prior to removal from service.

Objects and Advantages

It is therefore an object of the present invention to provide an apparatus and method for diagnosing servo motor operational status prior to removal.

A further object of the present invention is to test for proper servo motor rotor state feedback operation.

A further object of the present invention is to test for proper servo motor armature operation prior to removal.

It is a further object of the present invention to simplify the determination of motor configuration and operating parameters.

It is still another object of the present invention to automatically identify the motor configuration and operating parameters.

SUMMARY

The present invention provides an apparatus and method for testing a PMBL servo motor in place, to avoid removal of an operational motor. In accordance with the present invention, a test system is connected to the motor-under-test in place of the motor drive system. The PMBL servo motor comprises polyphase armature windings, a rotor, and rotor state feedback. The test system of the present invention comprises an armature driver to power the armature windings, the armature driver powers the rotor in a polarity sequence, driving the rotor in a series of rotations. The test system also comprises a feedback input for receiving rotor state. The test system performs rotor state feedback device tests. The rotor state feedback is tested for proper operation at a plurality of rotor positions. The servo motor may include a tachometer, measuring rotor speed, the tachometer may be tested during said rotations. Armature winding faults are identified by tests for shorts, winding balance, and proper rotation in response to electrical angle changes. Some motors include electrically released brakes, which the test system releases prior to dynamic testing. In the current embodiment, the armature driver generates a polarity sequence in which all of the armature windings are powered simultaneously. In another embodiment of the current invention, motor configuration and operating parameters are determined by the test system from motor identification. Said motor identification may be input by the operator or read from machine-readable tags.

BRIEF DESCRIPTION OF THE DRAWINGS

FIG. 3B-3F depicts typical rotor angle feedback signal formats FIG. 3G depicts the algorithm used to obtain rotor angle from an incremental encoder FIG. 10 is the layout of the motor data table

DESCRIPTION OF THE PREFERRED EMBODIMENT

Figures 1, 2:
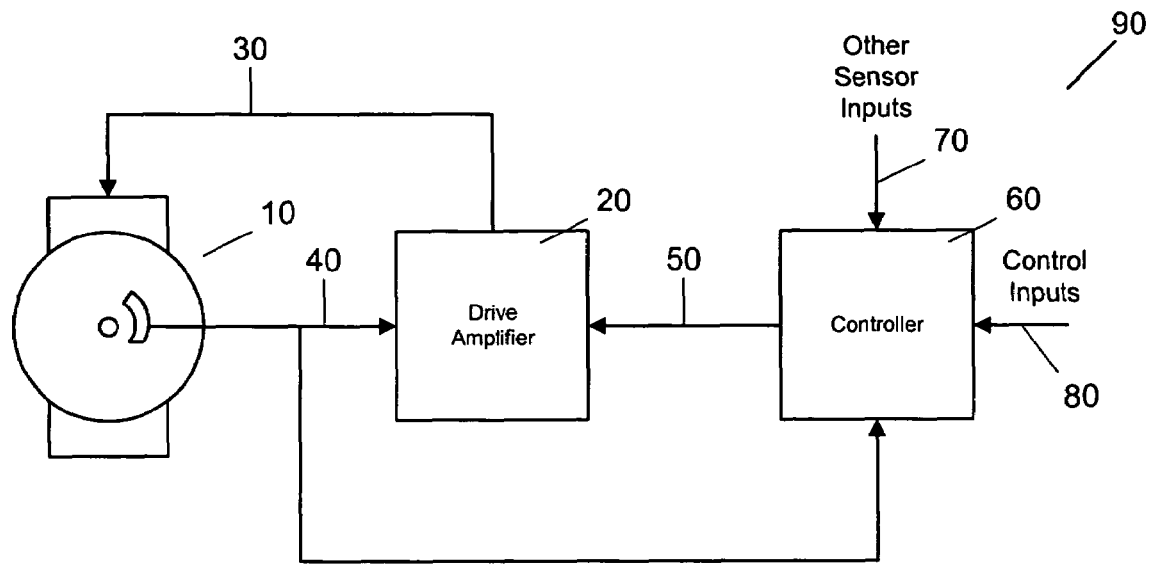
FIG. 1 is a block diagram of a typical motion control system including a PMBL servo motor
FIG. 2 is a table describing the six-state commutation of a DC servo motor
Figure 3A:
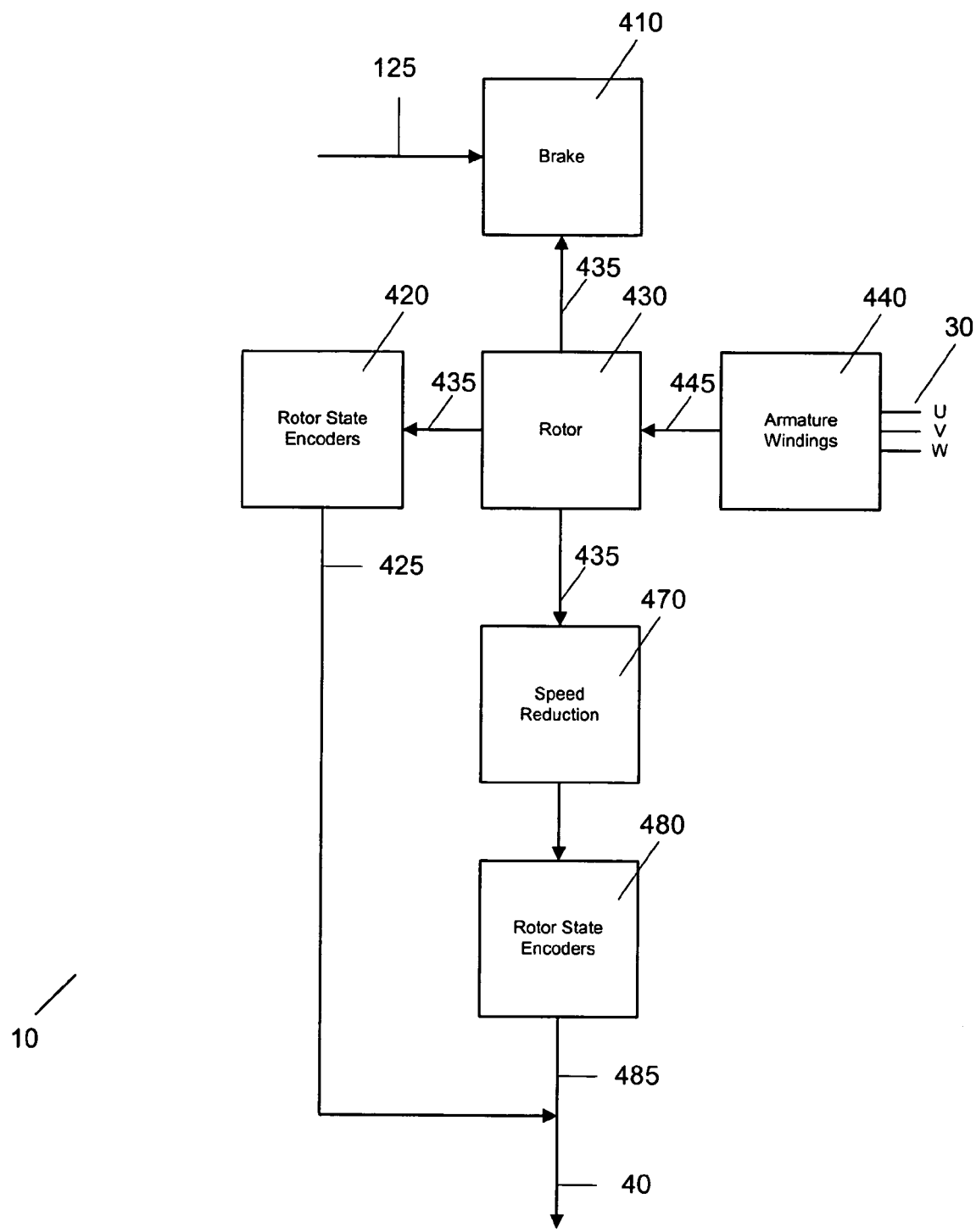
FIG. 3A is a block diagram of the components of a PMBL servo motor

Referring to FIG. 3A, a permanent magnet brushless (PMBL) servo motor block diagram is shown at 10. The PMBL motor comprises a rotor 430, a motor shaft 435, armature 440, and rotor state encoders 420 producing direct rotor state feedback 425. A PMBL motor may additionally comprise a brake 410 with an electric release input 125, the brake generally used to hold the motor shaft when the motor is unpowered. Motor 10 may drive another rotating machine, possibly through speed reduction 470, the rotating machine being equipped with rotor state encoders 480 producing indirect rotor state feedback 485. Direct rotor state feedback 425 and indirect rotor state feedback 485 combine to provide rotor state feedback 40. A case (not shown) provides mechanical support for the motor components. When motor 10 is connected to drive amplifier 20 and controller 60 as shown in FIG. 1, motor 10 is part of a control axis that performs a motive task.

At the core of PMBL motor 10 is moveable rotor 430. Rotor 430 is generally cylindrical and is rotatably supported along an axis of rotation. The axis of rotation is the longitudinal axis of the rotor, a line perpendicular to the circular cross section. Rotor 430 has a circumference around the circular cross section. Rotor 430 typically has a permanent magnetic field; the field direction is perpendicular to the axis of rotation. The rotor has 2N magnetic poles, alternating between North and South poles, disposed about the circumference of the rotor. The rotor magnetic field rotates with the rotor.

The rotor is fixed to a motor shaft 435. Motor shaft 435 communicates rotor position to other motor components and to the external load. The angle of rotation of the motor shaft relative to the motor case is the mechanical angle of the motor.

Armature 440 is stationary with respect to the motor case. Armature 440 is disposed about the circumference of rotor 430. Armature 440 comprises multiple windings. The windings are electrically grouped into multiple phases, where the windings of each phase are combined into one electrical winding. A typical PMBL motor comprises three phases. The three phases are generally Wye-connected, but may be delta-connected, in either case providing three terminals for armature drive.

The preferred embodiment tests three phase motors, but the extension to motors with more or less armature phases falls within the scope of the present invention. The application of a DC voltage between armature terminals powers multiple armature phases and produces a magnetic field. The armature magnetic field is generally perpendicular to the axis of rotation of rotor 430. The armature magnetic field is the vector sum of the magnetic fields of the powered phases. The direction of the armature magnetic field is an angle about the rotor's axis of rotation called the electrical angle of the motor. Applying power to a different set of terminals or reversing the polarity of the applied voltage across a pair of terminals produces a different electrical angle. The application of the DC power across a set of armature terminals is done in a drive pattern. In the standard motor commutation sequence shown in column 96 of FIG. 2, the drive pattern consists of applying the positive supply voltage to one terminal and the negative voltage to a second terminal, leaving one terminal unconnected. There are six possible drive combinations of this drive pattern shown in FIG. 2. The six drive combinations produce six electrical angles disposed about the circumference of the rotor at 60-degree intervals. The six drive combinations are applied in a sequence called a polarity sequence to produce desired rotor movement. For continuous motor rotation, the polarity sequence is in the order of increasing or decreasing electrical angle, producing forward or backward rotor rotation, respectively.

Figure 4:
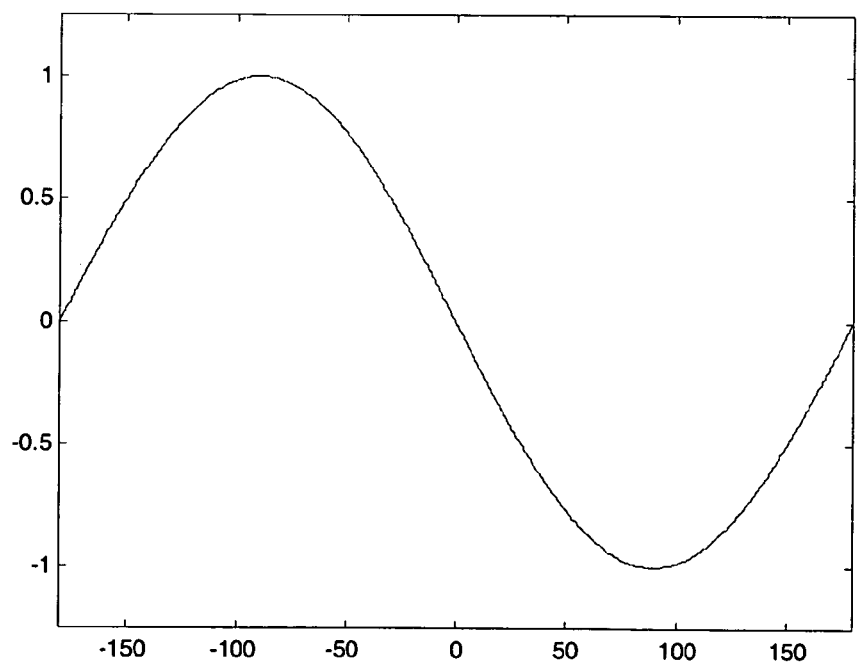
FIG. 4 depicts motor torque versus electrical angle

The armature magnetic field interacts with the rotor magnetic field to produce rotor torque and rotor movement if the torque produced is greater than the load. Refer to the torque curve in FIG. 4. The torque curve shows the rotor torque produced versus the angle difference between the rotor magnetic field direction and the armature magnetic field direction. The curve shows that at zero degrees no torque is produced and at +/−90-degrees maximum torque is produced. The direction of the rotor torque is toward the zero degree point on the curve at which point the rotor and armature magnetic fields are aligned. The point on the curve at ±180 degrees is an unstable point on the curve where the rotor magnetic field and armature magnetic field are aligned repulsively. The zero degree point on the curve, or unloaded stall point, is the point at which the rotor will stop if there is no load on the motor and the armature drive maintains the same electrical angle. The loaded stall point, where the motor stops because motor torque equals the motor load, can be up to 90-degrees from the unloaded stall point, depending on the load.

For continuous motor rotation, the armature drive must produce a rotating electrical angle. Drive amplifier 20 shown in FIG. 1 commutates the DC electrical power to produce armature drive in a polarity sequence that produces a rotating electrical angle. Drive amplifier 20 also adjusts the armature drive voltage and current to obtain the needed motor movement. In general, motor speed is proportional to the applied voltage and motor torque is proportional to applied current. N revolutions of the electrical angle are required per revolution of the mechanical angle. For a two-pole rotor, where N is equal to one, one revolution or complete cycle of the electrical angle produces one revolution of the mechanical angle. When N is greater than one, N revolutions of the electrical angle are required to produce one revolution of the mechanical angle.

In order to maintain maximum rotor torque, drive amplifier 20 must generate armature drive that produces an electrical angle that leads the rotor magnetic field by an angle close to 90-degrees. Rotor state feedback 40 provides the mechanical angle to drive amplifier 20. Drive amplifier 20 generates armature drive 30 at an electrical angle that leads rotor angle by approximately 90-degrees. Since the resolution of the armature drive is 60-degrees, the electrical angle actually leads the rotor angle by an angle in the range of 60-degrees and 120-degrees.

In a motor with multiple rotor magnetic pole pairs (N>1), the electrical angle is rotated at a multiple of the mechanical angle rotation rate. In general, the angle encoders are connected to motor shaft 435 and measure the mechanical angle. Between the shaft rotation and the armature drive, the rotation angle must be multiplied up from the mechanical angle rate to the electrical angle rate in order to produce the correct armature drive. The rate multiplication may be in the rotor angle encoder or may be done by drive amplifier 20.

Rotor state feedback comprises rotor angle feedback and sometimes rotor velocity feedback. An angle encoder, usually driven by the motor shaft, produces rotor angle feedback. Several different angle encoders are supported in the preferred embodiment. The supported angle encoders are Hall effect encoders, resolver encoders, incremental encoders, and serial encoders. These angle encoders will be described in detail. The encoded angle may be the mechanical angle of the motor or a multiple of the mechanical angle. The index angle from which the angle is measured may be aligned with a phase of the armature or may be offset from a phase of the armature. Angle feedback is provided at an angle resolution compatible with the motive task for which the motor is designed. Drive amplifier 20 is often built specifically for a particular motor and expects rotor angle feedback in a particular format and at a particular angle multiple, resolution, and offset.

Rotor velocity feedback, comprising rotor speed and direction, is used by either controller 60 or drive amplifier 20 for motor axis control. Whereas motors often comprise multiple shaft axis encoders, there is generally not more than one velocity encoder or tachometer.

In some motor drive systems, motor 10 will turn another rotating member through a speed reduction 470. The rotating member drives encoders 480 producing indirect rotor state feedback. Indirect rotor state feedback 485 is representative of rotor state and is used by drive amplifier 20 or controller 60 in addition to, or in lieu of direct rotor state feedback 425.

Electrically released brake 410 is generally a friction brake used to hold or stop rotor 430. A control axis may have a residual load that must be countered when motor 10 is unpowered. Brake 410 has an electrical release 125 to release the brake and allow motor movement.

PMBL DC motors generally use a drive scheme similar to that described above to power the motor. Electrical angle resolution of 60-degrees is sufficient for many applications. The DC motor produces some torque modulation because the coarse resolution of the electrical angle control moves the drive through a range of angles on the torque curve. Using a PMBL AC motor reduces torque modulation.

A PMBL AC motor is similar to a PMBL DC motor, each generally has a three-phase armature and each produces rotor state feedback. In an AC motor, the armature is normally driven with a 3-phase AC signal that produces finer control of the electrical angle as compared to a DC motor. The electrical angle can be driven to lead a rotor pole by close to 90-degrees to maintain maximum torque at all rotor angles. AC motors generally comprise a high-resolution angle encoder to support the AC drive amplifier.

A three-phase AC motor will respond to DC armature drive signals in much the same way a DC motor does. The electrical angle is controlled in 60-degree steps in response to the six drive combinations described above for DC motors. N revolutions of the electrical angle are required per revolution of the mechanical angle.

PMBL motors use a variety of angle and velocity encoders matched to the motive task of the motor. The FIG. 3B-3F show typical PMBL servo motor encoder output signals. Some feedback devices require power and/or drive signals to operate. Drive amplifier 20 provides power and drive signals, when required, to the encoder. Motor mounted shaft angle encoders provide rotor angle signals to the drive amplifier 20.

Figure 3B:
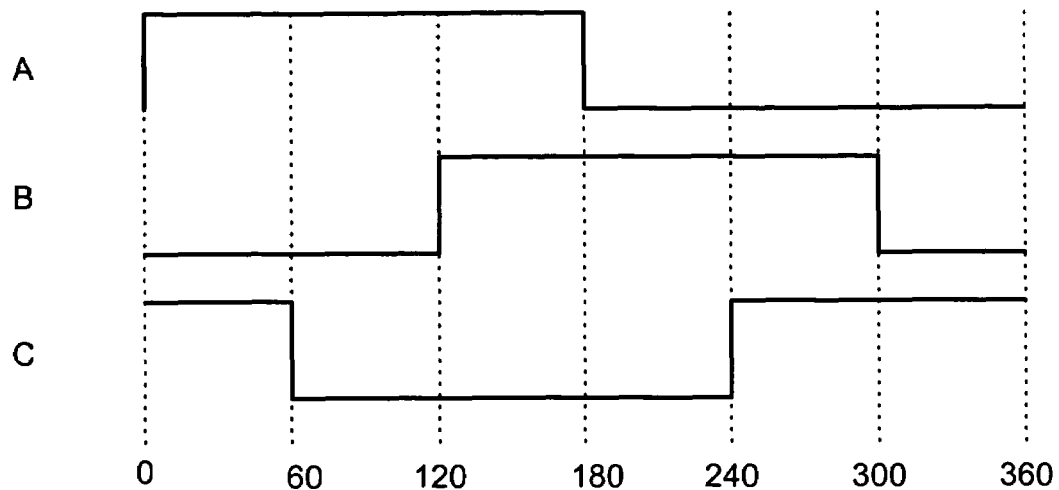

FIG. 3B shows the 120-degree six-state or Hall effect type encoder output versus rotor angle. In some motors, the six-state encoder is implemented by optical means rather than with Hall sensors. The 120-degree Hall encoders are commonly found on DC servo motors. Six-state encoders are also used in combination with incremental encoders for startup of AC motors. Six-state/Hall encoders generally require power from the drive amplifier, typically 5-volts. The three-phase output signals A, B, and C shown are typically open collector type outputs. Rotation in the forward direction is signified by phase B following phase A at a delay of 120-degrees and phase C following phase B at a delay of 120-degrees. Hall type encoders typically encode rotor angle multiplied by the number of rotor pole pairs such that the number of cycles of the Hall encoded angle during one shaft revolution is equal to the number of pole pairs and consequently, the number of electrical angle cycles per revolution.

Figure 3C:
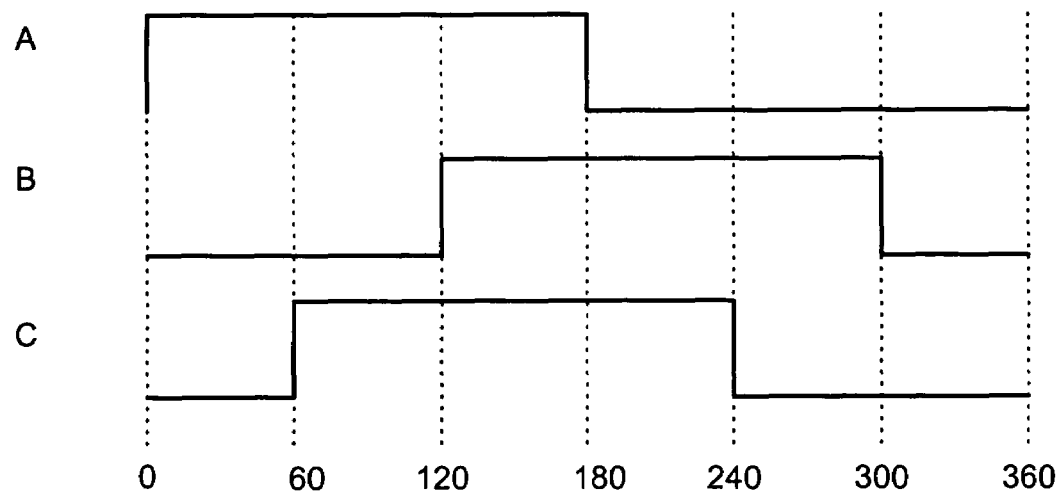

A variation of the standard Hall encoder is the 60-degree Hall encoder shown in FIG. 3C. As shown, phase C is inverted with respect to the 120-degree Hall encoder output signals, otherwise the 60-degree Hall encoder signals are identical to those of the 120-degree Hall encoder.

Figure 3D:
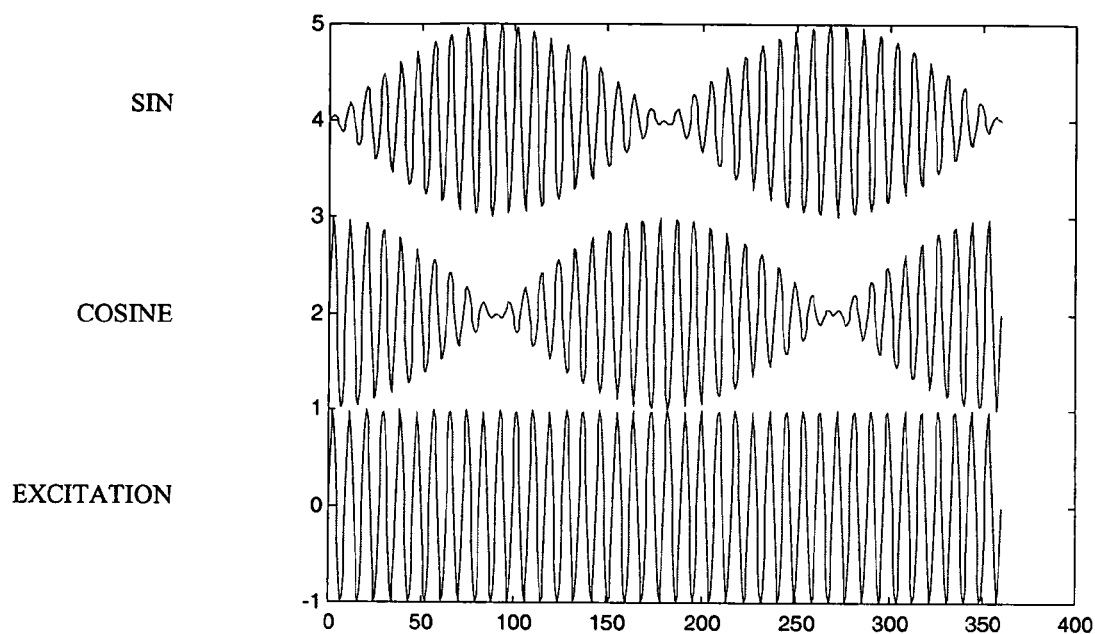

FIG. 3D shows resolver angle encoder output signals. The resolver requires an excitation signal in the 1 kHz to 20 kHz range. The excitation signal is typically a bipolar sine wave signal with a peak-to-peak amplitude of 5 volts. As shown, the SIN and COS outputs of the resolver encode shaft angle by multiplying the excitation signal by the sine and cosine respectively of the encoded shaft angle. Resolver angle encoders are classified in "speeds" where the speed represents the number of angle cycles per shaft revolution.

FIG. 3E shows typical incremental rotor angle encoder output signals. The output consists of A, B, and Z signals. Each pulse on the A or B line indicates rotor rotation of 1/N revolutions or 360/N degrees, where N is the number of pulses per revolution. The Z pulse is an index pulse indicating passage of an index angle. The direction of rotation is encoded in the order of pulses A and B. At power up, absolute rotor angle is unknown by the test system until the rotor rotates through the index angle. Incremental encoders typically require 5-volt power to operate. The A, B, and Z signals are typically TTL logic level outputs and may include true and complement outputs. Angle information is contained in each edge transition of the A and B signals.

Many types of serial shaft encoders are in use. In addition to rotor angle, serial encoders may communicate other dynamic and static motor parameters and information. In particular, serial encoders often provide absolute rotor angle (accumulated shaft revolutions), motor serial number and characteristics, and other implementation specific information. In addition, serial encoders often report error conditions and include integrity data such as a Cyclic Redundancy Check (CRC). FIG. 3F shows a data exchange in the Heidenhain Endat serial encoder interface. A clock input signal, along with a bidirectional data signal control communication. In response to the initial low-going clock edge, the encoder saves rotor angle. After two more clocks, six bits of mode command are clocked into the encoder on falling clock edges. The mode command indicates the data to be transferred during the data exchange. Mode command 111 shown requests rotor angle. After two more clock transitions, data bits produced by the encoder are transmitted on the data line. Start bit S, always high, indicates the start of data. Alarm bit A, if high, indicates an error condition in the encoder. The following n bits encode the saved rotor angle, followed by six bits of CRC. Serial encoders require external power, typically 5-volts.

A typical velocity encoder or tachometer encodes rotor velocity as a DC voltage proportional to rotor velocity. Forward rotation rate is encoded in positive voltages and reverse rotation rate as negative voltages. Due to tachometer implementation, a faulty tachometer may have dropouts, where the output voltage goes to zero, within one or more rotation ranges. Tachometers may require a power input, which may be ±15 volts.

Motors may have multiple angle encoders to satisfy their intended function. A motor will typically only have one of any one kind of angle encoder.

Figure 5A:
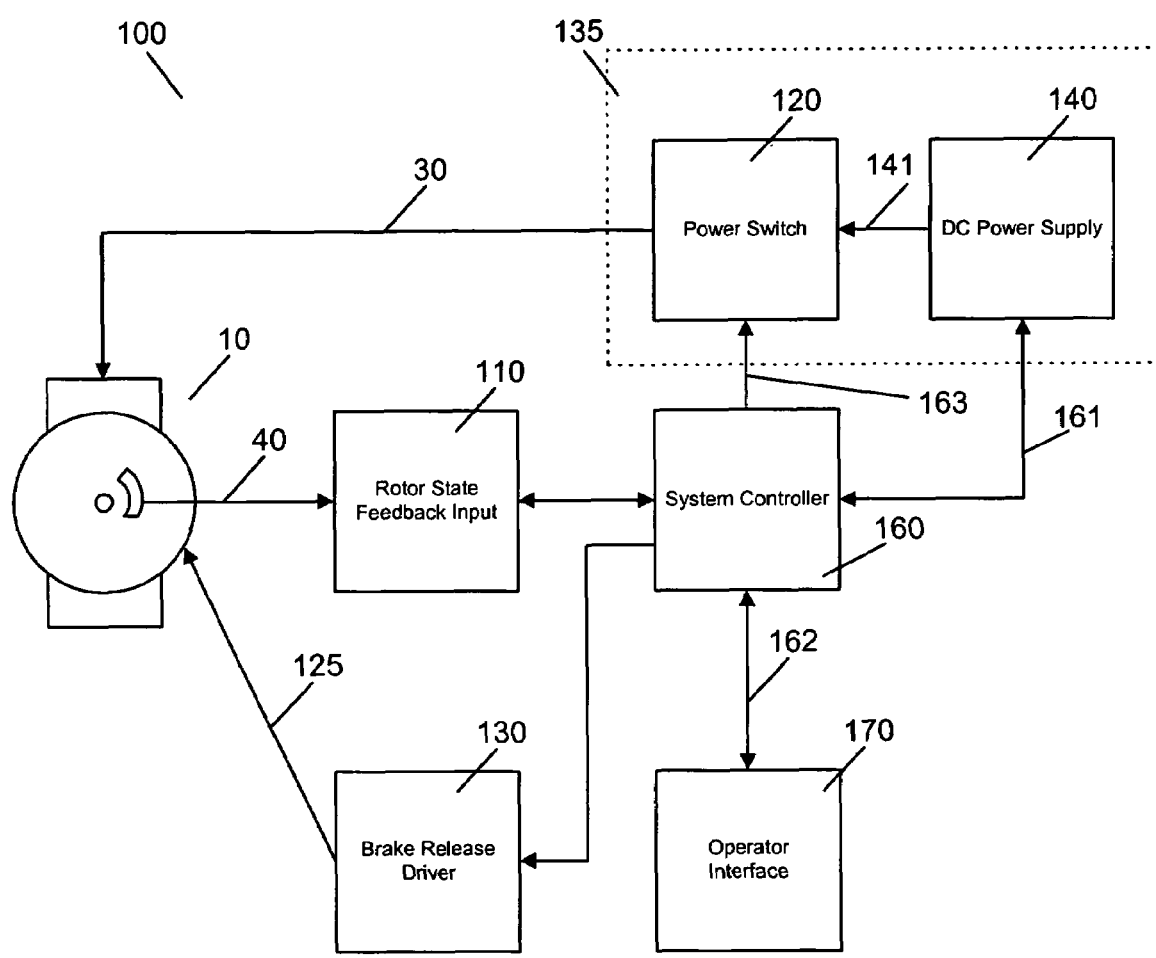
FIG. 5A is a block diagram of the test system of the present invention

Refer to FIG. 5A, the block diagram of test system 100. To test motor 10 in place, the electrical connections from motor 10 are disconnected from drive amplifier 20 and controller 60, and connected to test system 100, including armature drive 30, rotor state feedback 40, and brake release 125, if present. Test system 100 provides armature drive 30 and a brake release signal 125 to motor 10, receiving rotor state feedback signals 40 from motor 10. Static tests, run with no rotor movement, and dynamic tests, which require rotor movement, are run to check for proper operation of the armature windings, feedback encoders, and brake release.

In the preferred embodiment, system controller 160 controls the operation of test system 100. Armature driver 135 comprising DC power supply 140 and power switch 120. DC power supply 140 produces armature drive 30. DC power supply 140 is programmed by system controller 160 to produce a DC voltage 141. Power switch 120 switches DC voltage 141 to produce armature drive 30 under the control of system controller 160. Brake release 125 is produced by brake release driver 130 under control of system controller 160. System controller 160 interacts with the operator through operator interface 170 to acquire motor 10 configuration and operating parameters and to define the motor test sequence to be performed. Motor configuration defines the motor's feedback encoders. The motor operating parameters are the rated armature current and the number of rotor poles. Taken together, motor configuration and operating parameters define the individual motor information needed by system controller 160 to test the motor. System controller 160 decodes rotor state values of rotor angle or rotor velocity from each encoder connected to rotor state feedback input 110. Test results and test progress information is communicated from system controller 160 to operator interface 170.

Rotor state feedback input 110 receives rotor state feedback signals 40 from the PMBL servo motor-under-test 10. Feedback encoder signals represent rotor state values of rotor angle and rotor velocity. The encoded signals are converted to digital representation of the respective angle or velocity values, depending on the encoder. Some of the signals are converted in rotor state feedback input 110, others go through some hardware conditioning in rotor state feedback input 110 and are converted in system controller 160. Signal conversion to rotor state is described in detail below. Rotor state is used by test system 100 to evaluate the rotor state encoders and to verify correct rotor motion in response to the applied armature drive.

Test system 100 generates armature drive 30 in order to test armature 440 and to move rotor 430 to test the rotor state encoders 420, indirect rotor state encoders 480, and brake 410. To generate armature drive 30, system controller 160 interacts with DC power supply 140 and power switch 120. DC power supply 140 produces DC output 141 that is programmed, by system controller 160, to a voltage at a maximum current. Power supply 140 maintains the programmed output voltage until the maximum current is reached. At maximum current, the output voltage is reduced as required to maintain the maximum current. The preferred embodiment uses an Instek model PSH 1036 power supply, which includes output voltage and current monitors. The output monitors supply the present value of the output voltage and output current to system controller 160. The interface between system controller 160 and power supply 140 is via RS-232 connection 161. The interface between system controller 160 and power switch 120 is via digital signal lines 163.

Power switch 120 is connected to the DC output 141 of power supply 140 and to the armature terminals of motor 10. Armature drive 30 is produced by selectively applying DC power across a set of armature terminals, in a polarity sequence, under the control of system controller 160. Test system 100 produces six drive combinations. Each drive combination produces a different electrical angle. The six electrical angles are disposed at 60-degree intervals through the 360-degree electrical angle range. Each drive combination drives all three armature terminals. For each drive combination, two terminals are connected to one DC polarity and one terminal is connected to the other DC polarity. This drive pattern shorts two armature phases together, producing dynamic braking that reduces oscillation about the stall point. Dynamic braking occurs when an electrical load, the shorted windings, are presented to the electric voltage induced in the armature by the moving rotor, opposing rotor movement. Oscillations at the stall point would otherwise cause problems with encoder count tests.

The DC output 141 of power supply is applied directly across a pair of armature terminal by power switch 120, so the power supply monitors measure armature current and voltage. System controller 160 uses armature current and voltage to perform armature tests.

To move the rotor, test system 100 applies a drive combination, via armature drive 30, to the armature of motor 10 and then waits for rotor 430 to reach the associated stall point. Driving the electrical angle through one revolution consists of six steps of applying drive combinations in sequence of advancing electrical angle, each time waiting until rotor 430 reaches the stall point. One revolution of the motor shaft consists of 6n steps of advancing electrical angle.

Figures 6, 8:
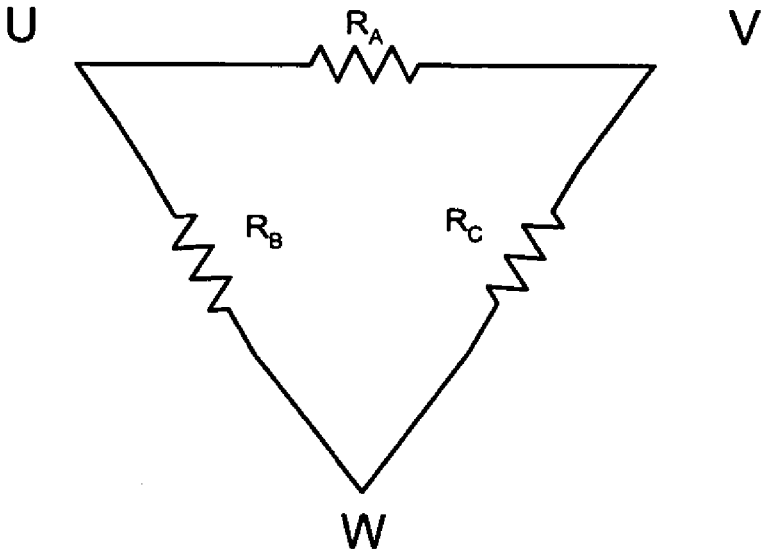
FIG. 6 is a table showing the test system commutation and typical winding resistance data
FIG. 8 is a schematic diagram of Delta-connected armature windings

FIG. 6 is a table of armature drive, in column 270, versus unloaded stall angle, in column 265, for one revolution of the electrical angle. Applying the polarity sequence of drive combinations in column 270, from top to bottom, produces one revolution, 360-degrees, of the electrical angle, in the forward direction, in sixty-degree rotation steps. Rotor angle column 265 lists the unloaded rotor angle for each armature drive step. After applying each drive combination, rotor 430 accelerates to a maximum speed, then decelerates as it approaches the stall point. The present invention performs tachometer tests during commutation steps, when the rotor speed is at a peak, but performs most feedback device and armature tests between commutation steps when rotor 430 is stopped. Traversing the polarity sequence in column 270 from bottom to top drives rotor 430 in the reverse direction.

Brake release driver 130 applies a brake release voltage to the motor brake, if present, on line 125. The motor brake is released upon application of power to brake 410. When testing a motor in place, a residual load is often present that must be countered either by the brake or armature drive. Brake release driver 130 is controlled by system controller 160. Brake 410 is released prior to running dynamic tests.

System controller 160 coordinates motor control, including the brake release and armature drive along with gathering rotor state data to determine test passage. System controller 160 also interacts with operator interface 170 to select motor configuration and operating parameters of the motor under test, and sequences tests under operator control. System controller 160 comprises a Motorola DSP56F805 DSP in the preferred embodiment.

In the preferred embodiment, the operator interface is hosted on a personal digital assistant (PDA) running motor test interface software. The PDA communicates with system controller 160 via a Bluetooth wireless interface 162. The Palm Tungsten PDA, used in the preferred embodiment, includes a built-in Bluetooth interface. A Bluetooth to RS-2326 serial interface module, Free2Move model F2M01, provides Bluetooth capability to system controller 160. The motor test software running on the PDA allows the operator to interactively define the configuration and operating parameters of the motor-under-test and to sequence through the tests. Progress results during the tests are displayed for operator information. Test results at the end of a test show either test passage or details of test failures. Many other operator interfaces are possible and fall within the broad scope of the current invention, including a personal computer (PC) or a dedicated interface in which operator data entry and display are physically integrated into test system 100. Wired or wireless communications media between operator interface 170 and system controller 160 may be employed.

Figure 5B:
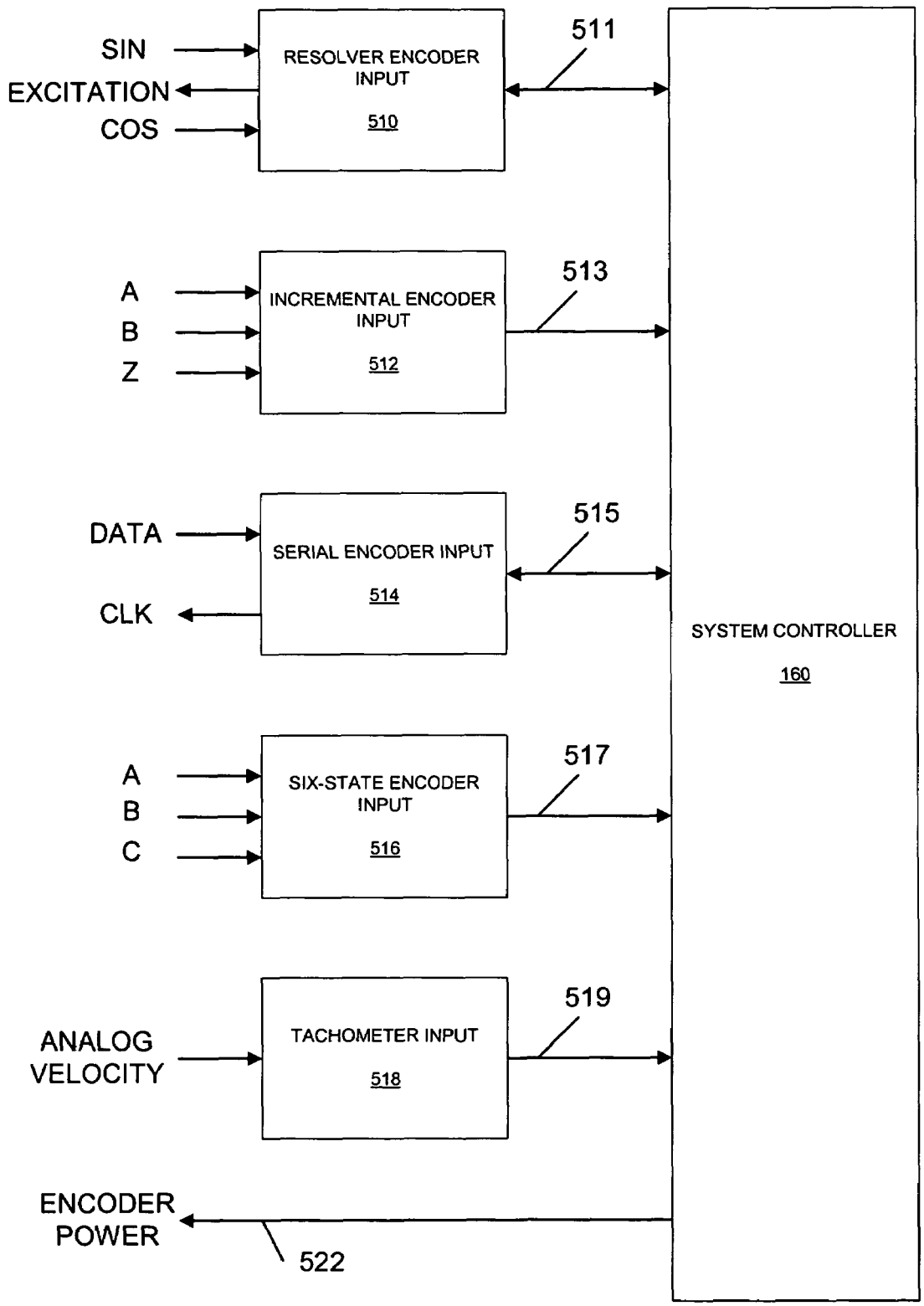
FIG. 5B depicts an expanded block diagram of the rotor state feedback input

Block 110 is the rotor state feedback input. Motors may comprise multiple rotor angle encoders and a rotor velocity encoder. FIG. 5B breaks out rotor state feedback input 110 into individual feedback interface blocks. The preferred embodiment supports angle encoder types of resolver encoder, incremental encoder, serial encoder, and six-state encoder; and an analog encoder for velocity feedback.

Resolver encoders are high-resolution angle encoders. In the preferred embodiment, block 510 contains a DSP, the Motorola DSP56801, to generate the excitation signal to drive the resolver and to decode the SIN and COS signals received from the resolver. The excitation signal is generated at an operator-selected frequency of 1 kHz- to 20 kHz , with a default value of 7 kHz . Excitation frequency and amplitude will be adjustable to accommodate resolvers on various motors. The SIN and COS signals are sampled at the positive peak of the excitation signal and digitized by an analog to digital converter (ADC) located on the DSP in block 510. Rotor angle is obtained by calculating the four-quadrant arctangent of the digitized SIN and COS values. Rotor angle is sent to system controller 160 through serial interface 511.

Incremental encoders are high-resolution angle encoders. In the preferred embodiment, the A, B, and Z signal lines are buffered in block 512 and drive digital inputs of system controller 160 on line 513. System controller 160 maintains a rotor position count. The position count is set to zero when the first index pulse is detected on the Z input, indicating that the rotor is positioned at the index angle. The position count is incremented or decremented according to state changes on inputs A and B according FIG. 3G. Position count is incremented or decremented on each transition of the A or B lines as indicated. This results in a count on every edge of A and B, so there are 4 times as many counts as pulse periods of either A or B. The position count rolls over to zero when incremented past the maximum count, i.e. when the motor shaft rotates past the index angle, and likewise rolls over from zero to the maximum count when decremented past zero. The position count indicates the rotor offset angle from the index position. Analog to Digital Converters (ADC) on each of the A, B, and Z inputs are used to verify appropriate encoder output signal levels for the level test.

Serial encoders are generally high-resolution angle encoders. Serial encoder clock and data lines are buffered in block 514 and drive digital I/O lines of system controller 160 on line 515. In test system 100, system controller 160 is programmed with the serial encoder interface protocol to acquire the encoded rotor angle. For the Heidenhain serial encoder, system controller 160 generates the clock signal at the required frequency, drives the data line with the mode command bits, and reads data returned on the data line. Either the alarm bit or a bad CRC on the received data signals an error condition, otherwise the decoded angle is accepted by system controller 160 as the shaft angle.

Six-state angle encoders are low-resolution angle encoders. Pull-up resistors and buffers in block 516 condition the signals for system controller 160. System controller 160 decodes shaft angle from the state of the three inputs received on line 517, according to FIG. 3B for 120-degree Hall encoders or FIG. 3C for 60-degree Hall encoders. Because the encoder provides 60-degree angle resolution, the angle reported in the software is the center of the 60-degree range.

Figure 7:
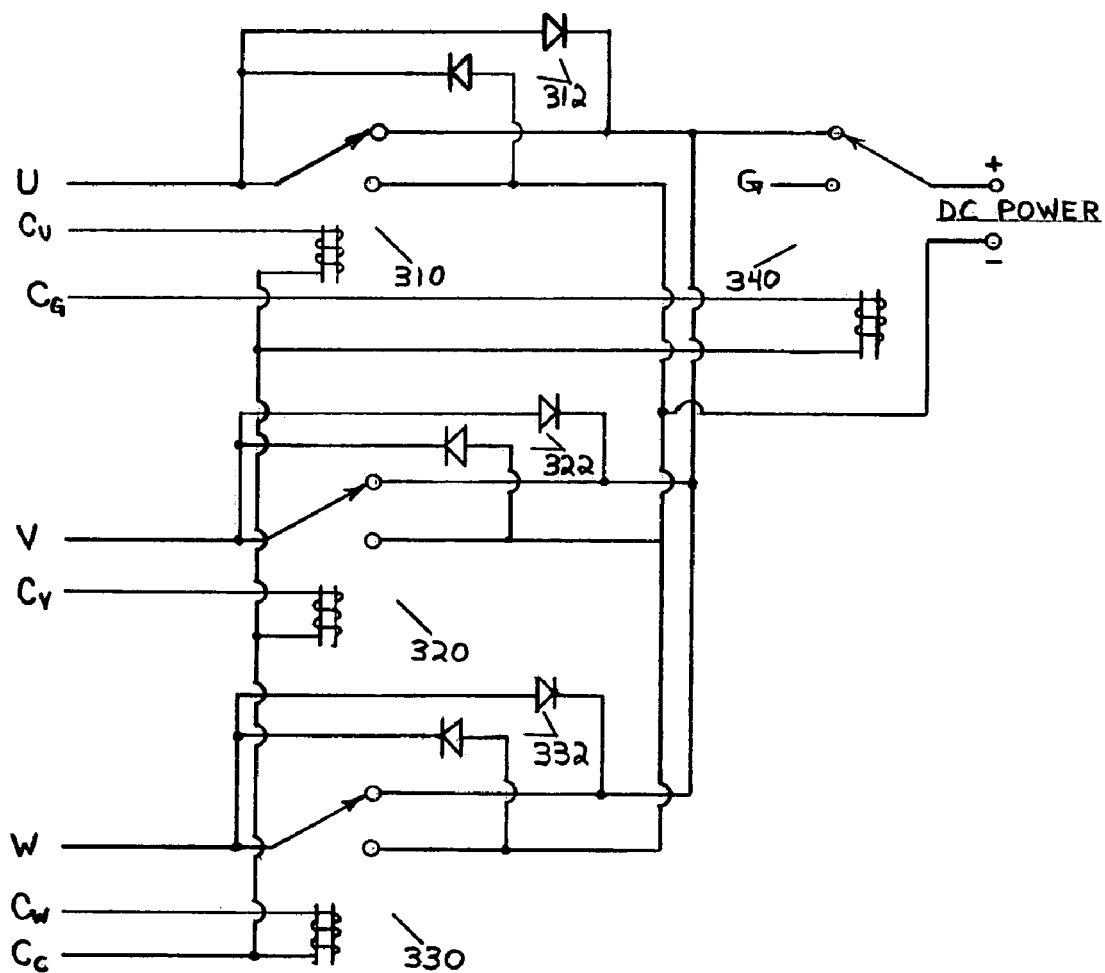
FIG. 7 is a schematic diagram of the power switch

FIG. 7 is a schematic diagram of power switch 120. The preferred embodiment uses relay switching in power switch 120. Other switching technologies fall within the scope of the present invention. With relay 340 in the position shown in FIG. 7, relay 310 is operative to switch armature connection U to either the positive or negative power supply polarity. Diodes 312 are protective diodes that conduct flyback current produced in the armature windings, to the power supply. In a like manner relay 320 and diodes 322 provide switching for armature connection V and relay 330 along with diodes 332 provide switching for armature connection W. Relay 340 enables a test for shorts between the armature windings and the motor case. Relay 340 can switch the positive power supply lead to motor case G. In the shorted winding test configuration, relays 310, 320, and 330 are switch to connect the negative power supply output to the U, V, and W armature terminals.

Motor 10 is generally connected to its drive amplifier 20 through a drive cable (not shown). The drive cable comprises wiring for armature drive 30, rotor state feedback 40, and motor release drive 125, if present. For each motor to be tested by the preferred embodiment of the present invention, a custom test cable (not shown) connects test system 100 to the motor. The test cable matches the motor electrical connections with the corresponding signal interfaces of test system 100. Some configurations require power conversion in the cable to match the power requirements of the motor's encoders to the power supplied by test system 100, on line 522.

Motor testing requires movement of the rotor. Test system 100 does not use rotor state feedback to determine armature drive 30, rather advances the electrical angle through the armature drive by 60-degrees, waits for the rotor to settle and performs tests. Some tests require that the rotor be moved through a series of rotations. In those cases, armature drive is applied according to the polarity sequence defined in column 270 of FIG. 6. Proceeding down column 270 produces rotor movement in the forward direction, moving up column 270 produces rotor movement in the reverse direction.

Operation

Test system 100 hardware, described above, enables running a set of tests to determine whether the motor is fully operational. The preferred embodiment divides the tests into two types: stationary and dynamic. The stationary tests run without moving the rotor. Dynamic tests check motor characteristics that require rotor motion or multiple rotor positions. Failure of any test indicates a motor failure.

The stationary test group includes encoder signal level tests, valid encoder state tests, a test for a shorted armature winding, and a balanced armature test. The balanced armature test is run during the stationary test with armature current well below the rated armature current, at 200, for example. Stationary tests are conducted with brake 410 engaged.

The dynamic tests include an encoder angle test, an armature balance test at full rated current, and a tachometer test. The dynamic tests are performed with brake 410 released. During the dynamic tests, the rotor is advanced in a series of rotations resulting from advancing electrical angle in 60-degree steps. All tests except the tachometer tests are run between rotations, after the rotor has come to a stop at the stall point. The electrical angle is advanced without regard for the angle received from the encoders.

The dynamic tests are broken up into two groups: a manual test group and an automatic test group. In the manual test group, the operator manually advances the electrical angle. The intent of this test group is to have the operator advance the rotor to a position from which the automatic test group can run without running into any stops, the limits of allowable travel for the motor load. However, if the operator advances the rotor sufficiently far in a given direction, the dynamic tests will complete without invoking the automatic test group, with the exception of the tachometer test. The automatic test group starts at a rotor position, advances for three revolutions of the rotor or until the encoder angle tests complete, whichever comes first. The automatic test group then returns the rotor to the starting position, while performing tachometer tests on the way back. The distance the rotor needs to advance to complete the encoder tests is dependent on the encoder types under test. Encoders providing indirect rotor state feedback need more rotor revolutions to complete proportional to the speed reduction.

During the dynamic tests, each rotation consists of advancing the electrical angle 60-degrees. Following each rotation, when the rotor stops at a stall point, the encoder signal level and state tests are performed along with encoder angle tests and armature balance tests.

The stationary tests are run with brake 410 engaged, if present. An incremental encoder and serial encoder, if present, are tested for valid logic level outputs. A Hall effect encoder, if present, is tested for a valid output state, according to the Hall interface type. The motor is tested for a short circuit between the armature windings and the motor case. The power switch applies the positive power supply connection to the motor case and the negative power supply connection to each of the three armature connections. The power supply current monitor is read and a fault current flow greater than 30 mA, for example, is considered a fault.

The last stationary test is the armature balance test. FIG. 8 shows a delta connected armature, where resistors $R_A$, $R_B$ and $R_C$ are the leg resistances. Regardless of the actual armature winding configuration, winding resistances may be analyzed as if delta connected in order to compute line-to-line resistances. The power supply maximum current output is set, power switch 120 is set to apply a voltage between armature connection U and armature connections V and W. System controller 160 reads the drive voltage from the power supply voltage monitor and resistance $R_U$, the resistance between terminal U and terminals V and W, is calculated as the drive voltage divided by the current. As can be seen in FIG. 8 $R_U$ is the parallel combination of $R_A$ and $R_B$. Likewise, a resistance $R_V$ is calculated from the ratio of the voltage to the current between armature terminal V and armature terminals U and W and $R_W$ is calculated from the ratio of the voltage to the current between armature terminal W and armature terminals U and V. The leg resistance can then be calculated as $$R_A = \frac{2R_U R_V R_W}{R_U R_W + R_V R_W - R_U R_V}$$

$$R_B = \frac{2R_U R_V R_W}{R_V R_W + R_U R_V - R_U R_W}$$

$$R_C = \frac{2R_U R_V R_W}{R_U R_V + R_U R_W - R_V R_W}$$

Line-to-line resistances are then calculated as the parallel combination of the leg resistors.

$$R_{UV} = \frac{R_A * (R_B + R_C)}{R_A + R_B + R_C}$$

$$R_{VW} = \frac{R_C * (R_A + R_B)}{R_A + R_B + R_C}$$

$$R_{UW} = \frac{R_B * (R_A + R_C)}{R_A + R_B + R_C}$$

The balance test is concluded by comparing the ratio of each of the three line-to-line resistances to the average of the three values. In the preferred embodiment a threshold value, 10 percent, for example, is used to trigger a balance test failure. The balance test passes if all three line-to-line resistances fall within ±10 percent of the average of the three resistances. Motor manufacturers generally specify line-to-line armature resistance values and tolerances. In the preferred embodiment, line-to-line resistances are displayed through the operator interface 170 for operator evaluation.

The dynamic tests are run with brake 410 released. The load driven by the motor-under-test in an application generally runs between stops. During the manual group test, the operator interactively positions the load within a range in which the subsequent automatic test group can safely run without running into the motor stops. The load is positioned by stepping or jogging the rotor forward or backward in 60-degree steps until the rotor is in the desired position. During the manual group test, if the motor is rotated far enough in a direction, some of the encoder tests may run to completion, otherwise the encoder tests will complete during the automatic group test.

At each rotation of the rotor during the dynamic tests, the armature balance test is run. The rotor must be stationary when the drive voltage is measured so that rotor-induced voltages in the armature windings are eliminated. The armature balance test is the same as described in the stationary tests above, except that full rated armature current is used in the test, which improves test accuracy. The same threshold value of ten percent is used to determine test passage. Armature line-to-line resistances are displayed through the operator interface for comparison to motor specifications. During the dynamic tests, one measurement of armature voltage and current is made at each rotation. Measurements at three consecutive rotations are required to gather data to complete the armature balance test.

Encoders are tested over a complete revolution of the rotor. One revolution requires six 60 degree electrical angle rotations for each rotor pole pair. At each rotation, the angle read from the encoder is evaluated against the expected range. Encoder angle tests are encoder specific and are described below.

The incremental encoder needs additional rotor rotation for evaluation. Because the incremental encoder provides angle increments from an index value, an additional shaft rotation may be needed before the index mark is first passed, depending on the rotor angle where the test starts. The incremental encoder is tested by counting the angle position increments (or decrements if the rotor is moved backwards during the test) between two index pulses. The number of counts is compared against the expected value. The count is displayed if the test fails.

Serial encoders often offer some level of self-diagnosis. The self-diagnosis may include outputs for operational errors, over temperature condition, and low battery. The self-diagnosis output is evaluated and a failure of the self-test causes the encoder test to fail. In addition, other serial encoder tests are performed.

A serial encoder stuck bit test determines if each of the bits included in the angle representation change during the course of the test. For example, if a serial encoder has a 13-bit angle representation resulting in 8192 counts in a revolution of the rotor, each of the thirteen bits are tested, over the course of the test, for a high and a low value.

Serial encoders encode absolute rotor angle. In addition, the encoders often include a revolution count such that the controller 60 can determine rotor position beyond a single rotation. The revolution counter is checked for proper operation with rotor movement during the serial encoder test. Serial encoders with nonvolatile memory often include check sums to validate stored data. The checksums are checked during the serial encoder test. Angle tests for serial encoders are performed by dividing a rotor revolution into four quadrants and checking the absolute angle at transitions between quadrants. The angle test determines if the encoded angle is monotonic throughout the test revolution. Encoder specific tests may be run on other known data output of the encoder to evaluate the integrity of the encoder.

Two types of resolver tests are run on motors with angle feedback in resolver format. The first test relies on the fact that regardless of angle, the sum of the squares of the sine and cosine outputs, called the vector level, should be constant. A first resolver test tracks the minimum, maximum and average values of the vector level. The preferred embodiment uses a threshold, ten percent, for example, to evaluate the difference between the minimum or maximum and the average value, to pass the test. The second resolver test verifies a correlation between the rotation angle and the resolver angle change. The correspondence between the rotation angle change and resolver angle change is known at the time of the test. A ten percent tolerance is allowed in the test to account for loading effects on the motor. The resolver angle tolerance may need to be wider for some motor types or environments as the load may exert different torque at different rotation angles and thus skew the rotation angle to resolver angle change relationship. Thus the tolerance may need to be operator programmable to handle a wide range of motors and environments.

Encoder signal lines undergo the following additional tests during the dynamic tests. Feedback signals are tested for valid voltage levels. Line state is analyzed for proper sequencing. Encoders often have true and complementary output. When present, the complementary outputs are tested for proper level and state.

Three revolutions of the motor may not be enough to test encoders indirectly driven by the motor through speed reduction. In such cases, the test must be extended to drive the encoder far enough to complete the test. The preferred embodiment accepts operator input of speed reduction and extends the test accordingly. For a 2:1 speed reduction, six revolutions will complete the test.

During the automatic group test, once the encoder test is finished or the rotor has rotated through three revolutions, the encoder test is concluded and the rotor is rotated back to the starting position. Tachometer tests are performed during the return rotation. The tachometer test consists of measuring the maximum rotor speed during each rotation with the angle encoder, and comparing the encoder-derived speed with the tachometer reported speed, sampled at the point of maximum encoder-derived speed. Some tachometers have angle dependent fault modes, so the speed comparison is performed at six angles spaced throughout a rotor revolution. The difference between the maximum and minimum speeds reported by the tachometer should be within ten percent, for example, of the average maximum speed over a revolution.

A motor is considered operational only if it passes all of the tests. Motor 10 may be tested at either end of the drive cable. Testing motor 10 at the drive amplifier end of the drive cable verifies the drive cable as well as motor 10, if the tests pass. If one or more tests fail when tested from the drive amplifier end of the drive cable, the motor is normally tested again without the drive cable. If the motor tests are successful, when tested without the drive cable, but failed when tested with the drive cable, the drive cable is identified as a faulty component. The motor connections are generally different from the connections at the drive amplifier end of the drive cable, so a different test cable is generally required for each of these two tests.

In a variation of the preferred embodiment, a test system similar to test system 100 in FIG. 5A, except without connections 161 and 163 between system controller 160 and DC power supply 140 and power switch 120, performs dynamic tests on PMBL motors. Armature driver 135 produces armature drive in a test sequence, independent of control by system controller 160. The test sequence consists of three forward rotor revolutions, followed by three reverse rotor revolutions, for example. The revolutions comprise rotor rotations of 60 degree electrical angle drive changes followed by a delay providing time for the rotor to stop at the stall point and encoder tests to be performed. A subset of the dynamic tests discussed above is available including encoder angle tests, the tachometer test, and the encoder signal level and state tests. Controller 160 coordinates testing upon detection of the stalled rotor through rotor state feedback.

The preferred embodiment as described is directed at testing PMBL motors prior to removal from their operating environment, however, the same apparatus and tests described are also useful as bench tests for determining the status of unconnected motors.

Figure 9:
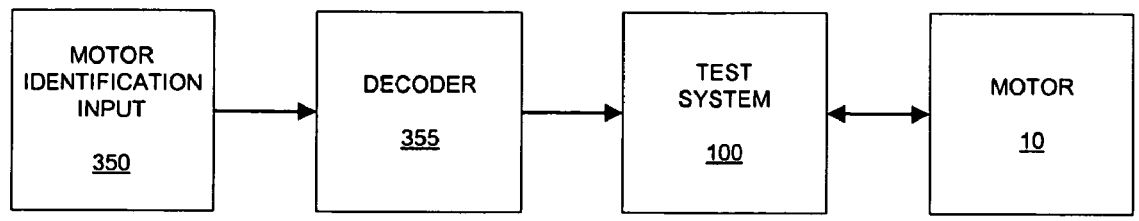
FIG. 9 is a block diagram of the automatic motor identification embodiment

Refer to FIG. 9, a block diagram of another embodiment of the invention. This embodiment includes input 350 for receiving motor identification, a decoder 355 for decoding the motor identification into motor configuration and operating parameters, motor test system 100, as described above, and motor 10 under test.

In this embodiment of the invention, motor identification input 350 is an expansion of the operator interface described above that allows the operator to input motor identification, the motor part number, for example. The motor part number may or may not encode the motor configuration and operating parameters. The part number is motor manufacturer specific. The part number typically has a particular form across a motor product line or across a manufacturer's complete product family. Decoder 355 is programmed to recognize the form of part numbers that encode motor configuration and operating parameters. Upon recognizing an encoded part number, decoder 355 decodes the fields within the part number that encode the motor configuration and operating parameters. Motor configuration is usually encoded in a repeatable field such that multiple feedback devices may be included within the part number. The operating parameters of rated current and the number of rotor poles are also encoded in the part number. Decoder 355 extracts the motor configuration from the part number, obtaining the feedback device types and the parameters related to each, and also extracts the operating parameters of rated current and the number of rotor poles.

For motors whose motor part number does not encode motor configuration and operating parameters, decoder 355 includes a database of motor information, for motors to be tested. The motor database includes data table 630 in FIG. 10 along with data retrieval software in decoder 355. The motor database associates motor identification to motor configuration and operating parameters for the motor. In the present embodiment, motor part numbers are stored in a linked list, each entry comprising a string such as MOTOR_ID_1 601 and pointer 602. Pointer 602 points to the next motor identification MOTOR_ID_2 603. Pointer 604 associated with MOTOR_ID_2 603 points to MOTOR_ID_3 605, and so on until the last motor identification, MOTOR_ID_N 607. The last motor identification in the linked list is indicated with a NULL (0) pointer 608. The data retrieval software searches through the link list, starting at the first motor identification in the linked list, MOTOR_ID_1 601, for a match between the motor identification in the table and the motor identification received from motor identification input 350.

When a match for the received motor identification is found in data table 630, the associated motor data is extracted from the table. Following each motor identification and pointer in the linked list in data table 630 is the motor configuration data followed by the motor operating parameters associated with the identified motor. The motor configuration data is a list of feedback devices along with each feedback device's parameters. The motor whose identification is MOTOR_ID_1 601 has two feedback devices, of types listed in field 609 and field 610. Parameters associated with these two feedback devices are contained in field 611 and field 612, respectively. NULL feedback device type 613 indicates the end of the list of feedback devices. Rated armature current 614 and the number of rotor poles 615 follow the feedback device list. Each motor identification in data table 630 includes the associated motor configuration and operating parameters. The configuration and operating parameters 616 are associated with motor identification 603 and configuration and operating parameters 617 are associated with motor identification 607.

The motor information decoded by decoder 355 is sent to system controller 160 to configure test system 100 to test motor 10. Testing of motor 10 is as described above for manually entered motor configuration and operating parameters.

A variant of the motor identification embodiment shown in FIG. 9 is electronic recognition of the motor. Motor identification input 350 includes a scanner that reads a motor identification tag. The scanner receives the motor identification that is then sent to decoder 355 as described above. The scanner can be a bar code scanner and the tag contains a bar code. In this variant, the scanner can also be a radio frequency identification (RFID) scanner and the tag an RFID tag. The tag would normally be placed on or near some part of the motor system.

Barcode tags and barcode scanners are well known in the art. The barcode tag encodes the motor identification in the widths of a series of alternating black and white bars on a tag. The optical scanner generally illuminates the bar code and decodes the identification from the reflected light. The barcode typically includes a checksum to assure a valid scan. Upon receiving a valid scan, a barcode scanner in motor identification input 350 sends the motor identification to decoder 355 for decoding of the motor configuration and operating parameters.

An RFID tag contains a small passive electronic circuit. When the RFID tag is illuminated with the radio frequency (RF) signal from the RFID scanner, the tag stores some of the energy and subsequently transmits the motor identification contained in the tag. The RFID scanner reads the transmitted motor identification. The tag generally includes an additional checksum to validate the scan. Upon receiving a valid scan, the RFID scanner in motor identification input 350 sends the motor identification to decoder 355 for decoding of the motor configuration and operating parameters.

Although preferred embodiments are described herein, it will be understood that the invention is capable of numerous modifications, rearrangements and substitutions of parts without departing from the scope of the invention as defined in the Claims.

What is claimed is:

1. An apparatus for testing a permanent magnet brushless servo motor, the motor comprising plural phase armature windings, a rotor, and a rotor state feedback device, said apparatus comprising:

a) an armature driver connected to the motor armature windings, said armature driver operative to power the armature in a polarity sequence, whereby the rotor is driven in a series of rotations;

b) a feedback input for receiving rotor state, said feedback input configurable for multiple motor configurations; and c) a test controller connected to said feedback input, said test controller operative to perform rotor state feedback device tests.

2. The apparatus of claim 1 wherein said polarity sequence drives all armature windings simultaneously.

3. The apparatus of claim 1 wherein said test controller is connected to said armature driver, and said test controller is operative to control rotor movement.

4. The apparatus of claim 3 wherein said apparatus additionally comprises a monitor to measure at least one armature operating parameter, said test controller connected to said monitor, said test controller operative to perform an armature test based on said operating parameter.

5. A method for testing a permanent magnet brushless servo motor, the motor comprising plural phase armature windings, a rotor, and a rotor state feedback device, said method comprising the steps of:

a) applying DC power to the armature windings in a polarity sequence, wherein all armature windings are simultaneously driven, whereby the rotor is driven in a series of rotations; and b) monitoring the feedback device output for expected operation at a plurality of said rotations.

6. The method of claim 5 additionally comprising the step of determining armature winding balance from armature voltages and currents determined at a plurality of said rotations.

7. The method of claim 6 wherein said armature winding balance comprises the ratios of each winding resistance to the mean winding resistance.

8. The method of claim 7 additionally comprising the step of comparing said ratios to a threshold.

9. An apparatus for testing a permanent magnet brushless servo motor, the motor comprising plural phase armature windings, a rotor, a rotor state feedback device, and a brake with a brake release, said apparatus comprising:

a) an armature driver connected to the armature windings, said armature driver operative to power the armature in a polarity sequence, whereby the rotor is driven in a series of rotations;

b) a feedback input for receiving rotor state;

c) a brake release driver for driving the brake release; and d) a test controller connected to said feedback input, connected to said armature driver, and connected to said brake release driver, said test controller operative to release the brake, control the rotor movement, perform rotor state feedback device tests, and perform armature tests.

10. An apparatus for testing a permanent magnet brushless servo motor, said apparatus comprising:

a) an input for receiving motor identification;

b) a decoder, connected to said input, for decoding the motor identification to obtain motor configuration and operating parameters; and c) a test system, connected to said decoder, and connected to the motor, for testing the motor according to said motor configuration and operating parameters.

11. The apparatus of claim 10 wherein said motor identification comprises a part number that includes die motor configuration and operating parameters.

12. The apparatus of claim 10 wherein said motor identification doesn't include motor configuration and operating parameters, said decoder operative to retrieve motor configuration and operating parameters from a database, for motors to be tested.

13. A method for testing a permanent magnet brushless servo motor, said method comprising:

a) inputting motor identification;

b) decoding motor operating parameters from said motor identification; and c) performing a feedback device test on the motor.

14. The method of claim 13 additionally comprising the step of performing an armature test.

* * * * *